(12) United States Patent
Onvlee et al.

(10) Patent No.: US 8,947,641 B2
(45) Date of Patent: Feb. 3, 2015

(54) LITHOGRAPHIC APPARATUS AND METHOD

(75) Inventors: Johannes Onvlee, s-Hertogenbosch (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 1884 days.

(21) Appl. No.: 11/730,191

(22) Filed: Mar. 29, 2007

(65) Prior Publication Data

US 2008/0100818 A1 May 1, 2008

Related U.S. Application Data

(63) Continuation-in-part of application No. 11/589,300, filed on Oct. 30, 2006, now Pat. No. 7,714,981.

(51) Int. Cl.
*G03F 7/20* (2006.01)
*G03F 1/44* (2012.01)
(Continued)

(52) U.S. Cl.
CPC .............. *G03F 7/70775* (2013.01); *G03F 1/44* (2013.01); *G03F 1/42* (2013.01); *G03F 7/707* (2013.01); *G03F 9/7011* (2013.01)
USPC ................. 355/75; 355/72; 355/77; 356/399; 356/400; 356/401; 356/616; 430/5

(58) Field of Classification Search
CPC ............. G03F 1/00; G03F 1/14; G03F 1/142; G03F 1/38; G03F 1/42; G03F 1/44; G03F 1/62; G03F 7/70; G03F 7/70283; G03F 7/70775; G03F 9/70–9/7034; G03F 9/7046; G03F 9/7049; G03F 7/7088; G03F 7/707
USPC .............................. 355/53, 55, 67, 72, 75, 77; 356/399–401, 614–618, 622, 624; 430/5

See application file for complete search history.

(56) References Cited

U.S. PATENT DOCUMENTS

| | | | |
|---|---|---|---|
| 5,646,413 | A | 7/1997 | Nishi |
| 5,894,056 | A | 4/1999 | Kakizaki et al. |

(Continued)

FOREIGN PATENT DOCUMENTS

| | | |
|---|---|---|
| EP | 1 182 509 A2 | 2/2002 |
| EP | 1 491 961 A1 | 12/2004 |

(Continued)

OTHER PUBLICATIONS

Non-Final Rejection mailed Feb. 23, 2009 for U.S. Appl. No. 11/589,300, filed Oct. 30, 2006, 9 pgs.

(Continued)

*Primary Examiner* — Colin Kreutzer
(74) *Attorney, Agent, or Firm* — Sterne, Kessler, Goldstein & Fox P.L.L.C.

(57) ABSTRACT

In a lithographic apparatus, a slip of a patterning device relative to a support, the support constructed to support the patterning device, may be provided by measuring a position of the support relative to a first structure of the lithographic apparatus; measuring a position of the patterning device relative to a second structure of the lithographic apparatus; determining a correlation between the position of the patterning device and the position of the support from the measured position of the support, the measured position of the patterning device, and the mutual positions of the first and second structures; and deriving from the correlation a slip of the patterning device relative to the support. The structure may include a projection system to project a radiation beam patterned by the patterning device. The projection system may be connected to a frame, such as a metrology frame of the lithographic apparatus.

20 Claims, 2 Drawing Sheets

(51) Int. Cl.
*G03F 1/42* (2012.01)
*G03F 9/00* (2006.01)

(56) References Cited

U.S. PATENT DOCUMENTS

| | | | |
|---|---|---|---|
| 6,040,096 | A | 3/2000 | Kakizaki et al. |
| 6,714,691 | B2 * | 3/2004 | Outsuka ........................ 382/294 |
| 6,819,425 | B2 | 11/2004 | Kwan |
| 7,446,749 | B2 | 11/2008 | Lee et al. |
| 7,714,981 | B2 * | 5/2010 | Onvlee et al. .................... 355/53 |
| 2003/0016338 | A1 * | 1/2003 | Yasuda et al. .................... 355/55 |
| 2003/0025893 | A1 * | 2/2003 | Nishi ............................. 355/53 |
| 2003/0197841 | A1 * | 10/2003 | Araki et al. ..................... 355/50 |
| 2005/0018162 | A1 * | 1/2005 | Leenders et al. ................ 355/67 |
| 2005/0128453 | A1 | 6/2005 | Miura |
| 2005/0168714 | A1 * | 8/2005 | Renkens et al. ................ 355/53 |
| 2006/0007442 | A1 * | 1/2006 | Heerens et al. ................ 356/401 |
| 2006/0023178 | A1 * | 2/2006 | Loopstra et al. ................ 355/53 |
| 2006/0139595 | A1 * | 6/2006 | Koenen et al. .................. 355/55 |
| 2008/0100819 | A1 | 5/2008 | Onvlee et al. |

FOREIGN PATENT DOCUMENTS

| | | |
|---|---|---|
| JP | 09-171246 A | 6/1997 |
| JP | 09-246168 A | 9/1997 |
| JP | 10-247618 A | 9/1998 |
| JP | 11-307436 A | 11/1999 |
| JP | 2001-135571 A | 5/2001 |
| KR | 2002-0016531 A | 3/2002 |
| KR | 2005-0002427 A | 1/2005 |

OTHER PUBLICATIONS

Office Action Summary for Korean Application No. 10-2007-0108805 mailed Jan. 20, 2009, 4 pgs.
Search Report for European Application No. 07075929.5—2222 mailed Mar. 7, 2008, 3 pgs.
Final Rejection mailed Jun. 16, 2009 for U.S. Appl. No. 11/589,300, filed Oct. 30, 2006; 10 pages.
Notice of Allowance mailed Feb. 22, 2010 for U.S. Appl. No. 11/589,300, filed Oct. 30, 2006; 6 pages.

* cited by examiner

LITHOGRAPHIC APPARATUS AND METHOD

RELATED APPLICATIONS

This application is a continuation-in-part of U.S. application Ser. No. 11/589,300, filed Oct. 30, 2006 (that issued as U.S. Pat. No. 7,714,981 on May 11, 2010), the entire contents of which is hereby incorporated by reference.

BACKGROUND

1. Field

The present invention relates to a lithographic apparatus, a method to detect a slip of a patterning device in such lithographic apparatus, and to a patterning device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a scanning type lithographic apparatus, a mask (or patterning device) is carried by a support, also referred to as a mask table or patterning device table. While generating a pattern on a target portion of a substrate, the mask table performs scanning movements along a line of movement, in a single scan direction or scanning in both (i.e. opposite) directions along the line of movement. When a reversal of direction takes place, the mask table is decelerated and accelerated between the successive scanning movements. Also, the mask table is accelerated and decelerated before and after each scanning movement in a specific direction. Conventionally, the scanning movements are made with constant velocity. However, the scanning movements may also at least partly be made with varying velocity, e.g. the movements including at least part of the deceleration and/or acceleration phases.

The mask table supports, i.e. bears the weight of, the mask. It holds the mask in a manner that depends on the orientation of the mask, the design of the lithographic apparatus, and other conditions, such as for example whether or not the mask is held in a vacuum environment. The mask table may include a frame or a table, for example, which may be fixed or movable as required. The mask table (and its control system) may ensure that the mask is at a desired position, for example with respect to the projection system.

The mask is coupled to the mask table through a clamp. Conventionally, the mask is coupled to the mask table through a vacuum clamp which may be implemented as one or more vacuum pads provided on the mask table, where at least a part of a circumferential area of the mask is held onto the vacuum pads. By the clamp, a normal force between adjacent surfaces of the mask and the mask table is generated, resulting in a friction between contacting surfaces of the mask and the mask table. The vacuum pads include one or more openings coupled to a gas discharge and supply system. Instead of a vacuum coupling between the mask and the mask table, other forms of couplings based on friction between the mask and the mask table are conceivable, such as electrostatic or mechanical clamping techniques to hold the mask against the mask table.

In an ongoing development, increasing throughput requirements placed on lithographic apparatus lead to increasing scanning velocities. Consequently, deceleration and acceleration of the mask table increase. In the deceleration and acceleration phases, increased inertia forces act on the mask table and on the mask.

It is known that inertia forces acting on the mask table and the mask may lead to slip of the mask and the mask table relative to each other. The slip usually is on the order of nanometers. For relatively low decelerations and accelerations, the slip has appeared to be low and approximately constant over time, changing its direction with each deceleration/acceleration phase. In such circumstances, the slip may be ignored if it is sufficiently low, or the slip may be compensated by suitably calibrating a positioning device controlling the position (and hence, the movement) of the mask table and/or the substrate stage.

However, with increasing decelerations and accelerations, the slip occurring between the mask and the mask table increases, and becomes variable and unpredictable. Factors influencing the amount of slip may include, but may not be limited to, a flatness and roughness of the surfaces of the mask and the mask table engaging each other, a humidity of the atmosphere(s) in which the mask and the mask table are handled, a contamination of the mask or the mask table, and a degree of vacuum when the mask is held on the mask table by vacuum pads. Thus, a calibration of the positioning device will not lead to a correct positioning of the mask table and/or the substrate stage under the circumstances of high inertia forces.

Not only the speed of movement and acceleration of the mask table may tend to increase, also, accuracy requirements on the lithographic apparatus may become more stringent. Therefore, slip of the mask becomes less tolerable, as slip of the mask may result in a position error of the pattern projected onto the substrate.

SUMMARY

It is desirable to detect a slip of the patterning device in the lithographic apparatus.

According to an embodiment of the invention, there is provided a lithographic apparatus including:
  an illumination system configured to condition a radiation beam;
  a support constructed to support a patterning device, the patterning device being capable of imparting the radiation beam with a pattern in its cross-section to form a patterned radiation beam;
  a substrate table constructed to hold a substrate; and
  a projection system configured to project the patterned radiation beam onto a target portion of the substrate,
  the lithographic apparatus including a support position sensor to measure a position of the support relative to a first structure of the lithographic apparatus, and a patterning device position sensor to measure a position of the patterning device relative to a second structure of the lithographic apparatus, a control device of the lithographic apparatus being configured to determine a correlation between the position of the patterning device and the position of the support from the position measured by the support position sensor, the position measured by the patterning device position sensor, and the mutual positions of the first and second structures.

In another embodiment of the invention, there is provided a method to detect, in a lithographic apparatus, slip of a patterning device relative to a support, the support being constructed to support the patterning device, the method including:

measuring a position of the support relative to a first structure of the lithographic apparatus;

measuring a position of the patterning device relative to a second structure of the lithographic apparatus;

determining a correlation between the position of the patterning device and the position of the support from the measured position of the support, the measured position of the patterning device, and the mutual positions of the first and second structures; and deriving from the correlation a slip of the patterning device relative to the support.

In yet another embodiment of the invention, there is provided a patterning device comprising a measurement pattern to cooperate with a patterning device position sensor of a lithographic apparatus, the patterning device position sensor to measure a position of the patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
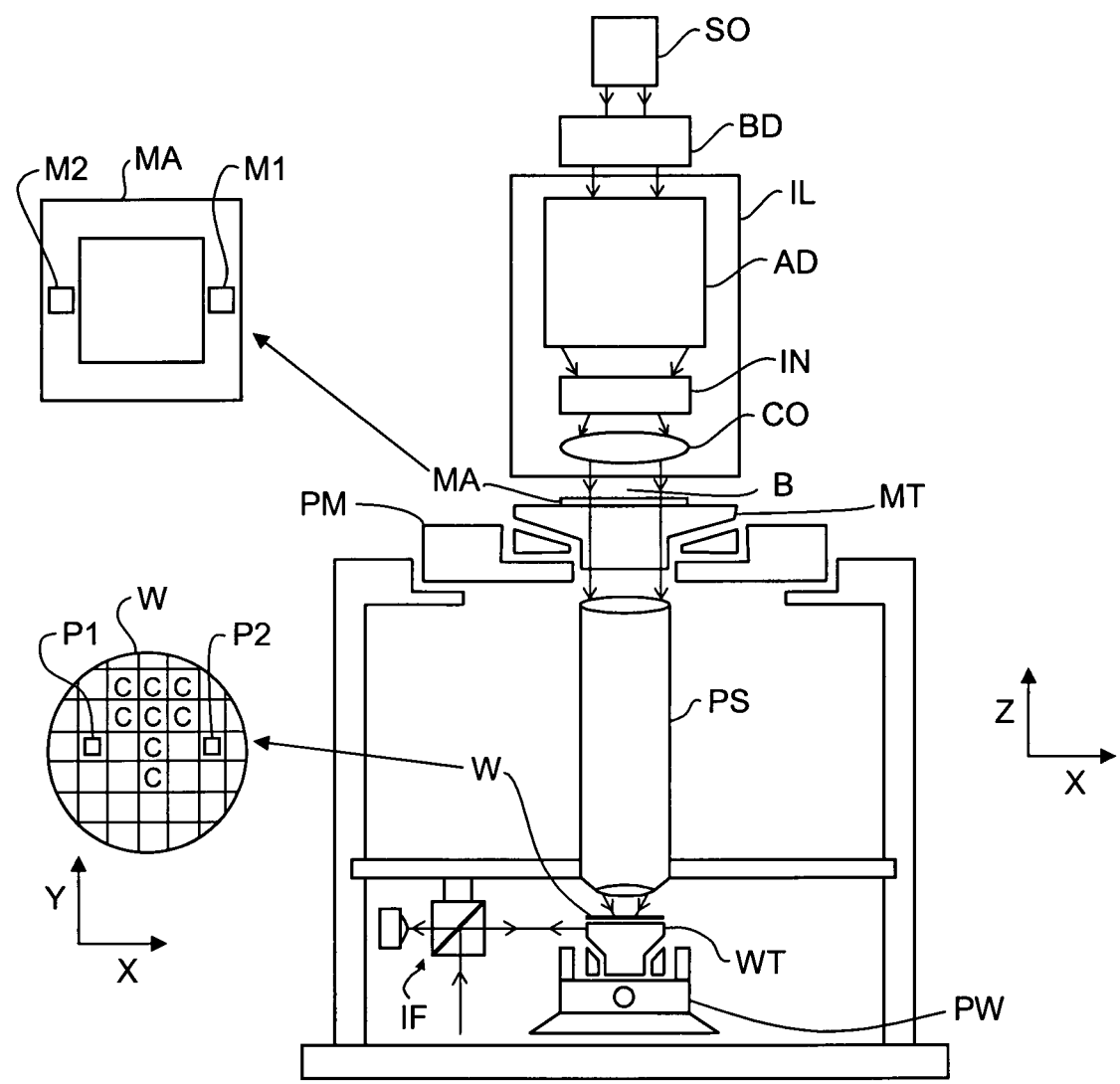
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device or mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
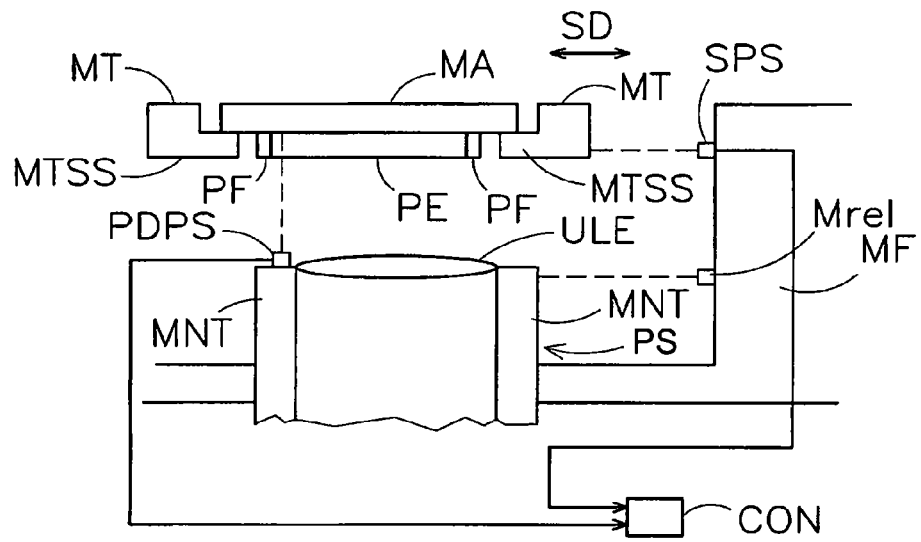
FIG. 2 depicts a schematic view, partly in cross-sectional view, of a part of a lithographic apparatus according to an embodiment of the invention.
Figure 3:
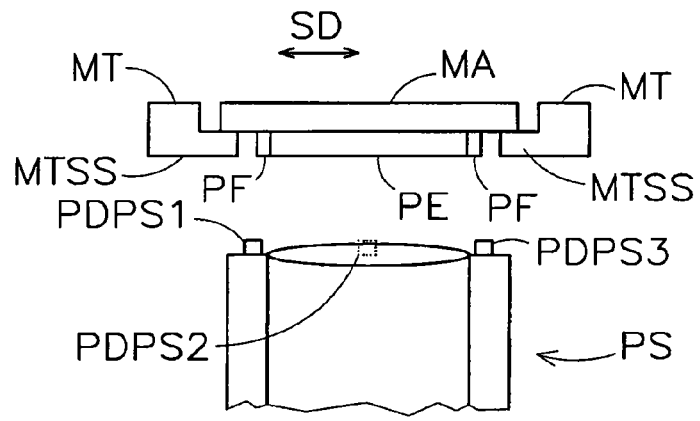
FIG. 3 depicts a schematic, cross-sectional view of a support, patterning device and projection system of a lithographic apparatus according to an embodiment of the invention.

FIGS. 2 and 3 each show a mask table MT holding a patterning device or mask MA. In operation, the mask table may be moved in a scanning direction indicated by arrow SD. Further, FIGS. 2 and 3 depict an upstream lens ULE and mounting MNT thereof of projection system PS. FIG. 2 shows metrology frame MF to which projection system PS is mounted. The metrology frame may serve as a reference, i.e. a reference structure, in the lithographic apparatus: on the one hand, structures, such as in this example the projection system, may be connected to it, while on the other hand, measurements may be performed using the metrology frame as a reference. The latter is in this example the case with the support position sensor SPS, which measures the position of the support relative to the metrology frame. FIG. 2 further shows patterning device position sensor PDPS which is configured to measure a position of the patterning device or mask relative to the projection system. As the projection system is mounted to the metrology frame, this implies that a measurement of the position of the patterning device or mask relative to the projection system also provides information about the position of the patterning device or mask relative to the metrology frame to which the projection system PS is mounted. The support position sensor SPS as well as the patterning device position sensor PDPS may include any suitable type of sensor, such as an optical sensor (e.g. an interferometer or encoder), inductive, capacitive or any other type of sensor. An existing optical sensor (e.g. encoder, interferometer) to measure a position of the mask table may be included in the support position sensor SPS.

By measuring the position of the patterning device or mask relative to the projection system and measuring the position of the mask table relative to a reference (in this case the metrology frame to which the projection system is mounted), a position of the patterning device or mask and the mask table with respect to each other can be determined. In the embodiment as depicted and described with reference to FIG. 2, the projection system and the metrology frame have been applied as structures with respect to which a position is measured. Generally speaking, within the context of this document, any position of the support may be measured (by the support position sensor) with respect to a first structure, while the position of the patterning device may be measured (by the patterning device position sensor) with respect to a second structure. The projection system thus forms an example of the second structure, while the metrology frame forms an example of the first structure. As will be explained in some more detail below, the first and second structures are thus not limited to the metrology frame and the patterning device respectively: the first and second structures may comprise any other reference, frame or element of the lithographic apparatus.

The projection system (in general the second structure) may be interconnected with the metrology frame (in general the first structure), to thereby form a single structure and possibly omitting a need to determine (e.g. measure) a position of the first structure with respect to the second structure by e.g. structures position measurement system Mrel. Alternatively, the projection system (in general the second structure) may be connected to the reference frame (in general the first structure) for a variety of reasons: e.g. to allow a damping of vibrations or other movements of the metrology frame. In case of a movable connection, the lithographic apparatus may determine a mutual position of the projection system and the metrology frame relative to each other, and take into account the relative position when determining the correlation between the position of the patterning device and the position of the support. Still further, the second structure may be separate from the first structure. In case of separate or movably connected structures, the mutual position of the first and second structures needs to be taken into account. As explained elsewhere in this document, the relative position of the structures can be measured. Alternatively, the relative position of the structures may be known, e.g. as the relative positions do not change when operating the lithographic apparatus, or as the relative position is a known parameter in the lithographic apparatus.

The relative position may be compared to one or more previous measurements or one or more previously determined relative positions. Slip of the patterning device or mask relative to the support will now translate into a difference in relative position compared to a previous measurement. The determining of the relative positions, comparing of the relative position to a previously determined relative position or any other reference such as a desired relative position, and the deriving of a slip between the patterning device or mask and the mask table from the comparison, may be performed by control device CON in FIG. 2, which may form part of an existing control device (such as a microcontroller, microprocessor or other control device of the lithographic apparatus) or may at least in part be formed by suitable hardware to perform the steps. In more general words, instead of comparing relative positions, any correlation between the positions as measured by the patterning device position sensor and the support position sensor, may be applied to determine the slip.

A slip having been determined, the control device may take appropriate actions to compensate for such slip, such actions may include a controlling of a position and/or position timing of the mask table when performing a scanning movement, a generation of a warning signal, a stopping of an operation of the scanning of the lithographic apparatus, etc. Further, applied acceleration forces may be reduced to reduce the slip to within acceptable limits.

A relative position of the patterning device or mask and mask table may be compared to a relative position which has previously been obtained during a movement in a same scanning direction or in opposite scanning directions. The inventors realized that, when the mask table is performing (e.g. scanning) movements in alternating directions, the patterning device or mask may slip between two stable positions each time when a direction of movement is reversed. Such slip may be derived from a comparison of the determined relative position with a relative position obtained during a previous movement of the mask table in an opposite direction. By comparing relative positions obtained during movements in the same direction, other forms of slip may be found, such as a "drifting" of the patterning device or mask in one direction.

The patterning device position sensor may be mounted to any suitable part of the projection system, e.g. adjacent to upstream projection lens ULE thereof, to a mounting MNT of such upstream projection lens, thereby not interfering with the patterned beam to be projected onto the substrate. Further, by mounting the patterning device position sensor to the projection system, additional complexity of the mask table, and thereby additional weight carried by the mask table, additional volume etc., may be prevented. Thereby, requirements as to a high scanning speed, high accelerations of the mask table, etc. may not be adversely affected by the patterning device position sensor.

As explained above, in the above example, the patterning device position sensor as well as the support position sensor measure a position relative to the projection system which is connected to the metrology frame of the lithographic apparatus, thereby allowing the patterning device position sensor to be positioned on the projection system, providing the effect (s) as described above. Alternatively, the positions are measured relative to the metrology frame, or in another embodiment, one of the positions (e.g. the mask position) can be measured relative to the projection system, while the other one of the positions (e.g. the mask table position) can be measured relative to the metrology frame. These alternatives depending on a possible use of existing position sensors in the lithographic apparatus, e.g. an existing sensor to measure the position of the mask table relative to e.g. the metrology frame. Further, more in general, the patterning device position sensor as well as the support position sensor may measure the position relative to any other suitable structure, e.g. any other suitable part of the lithographic apparatus. The structure may e.g. include any substantially stationary part of the lithographic apparatus, i.e. any non moving, e.g. non scanning, part of the lithographic apparatus. By measuring positions relative to a substantially stationary part, a stable and accurate measurement may be provided, while corresponding position sensors may (at least in part) be mounted to that stationary part of the lithographic apparatus, thereby possibly preventing an increase in mass and volume of movable parts of the lithographic apparatus.

Referring to FIGS. 2 and 3, opposite side areas of patterning device or mask MA are supported on the mask table MT at two opposite side supports MTSS thereof. In the areas of the patterning device or mask MA and the mask table MT engaging each other, the mask table MT is provided with vacuum pads or other attachment devices (such as electrostatic clamps, mechanical clamps, etc.) provided in an upper surface of mask table side supports MTSS for holding the mask MA against the side supports MTSS. The patterning device or mask MA is provided with a pellicle frame PF having a pellicle PE to keep possible contamination away from the mask. Alternatively to the embodiment shown here, in a different embodiment of the mask table, the patterning device or mask may be applied to an underside of a mask table, instead of an upper side.

As shown in FIG. 3, a plurality of patterning device position sensors (in this example 3 sensors PDPS1, PDPS2 and PDPS3) may be provided, which may have several effects. Firstly, the plurality of patterning device position sensors may be applied to perform position measurements in different position ranges of the mask table along its range of movement: as the mask table moves, it may get out of range of one or more of the position sensors, the plurality of position sensors may now allow performing a measurement with one or more of the other patterning device position sensors. Further possible effects of a plurality of position sensors will be described below.

In case that the patterning device position sensors include an encoder, an encoder pattern may be provided on the patterning device or mask. The encoder pattern may include discrete encoder patterns (such as the patterns PAT1, PAT2, PAT3 in FIG. 4), however may also include one or more encoder patterns extending along a side of the patterning device or mask, such as a side extending along the scanning direction, thereby allowing to perform position measurements over a certain range of movement of the mask table, such range of movement being determined by a size of length of the encoder pattern. In case of discrete patterns, a signal will be provided by the encoders only during the time within which the patterns are in an encoder beam of the encoder(s), thus the encoders providing a signal only in certain positions of the mask table. Also, multiple discrete encoder patterns may be applied, the encoder patterns being laid out distantly along a side of the patterning device extending in the direction of movement of the mask table.

Figure 4:
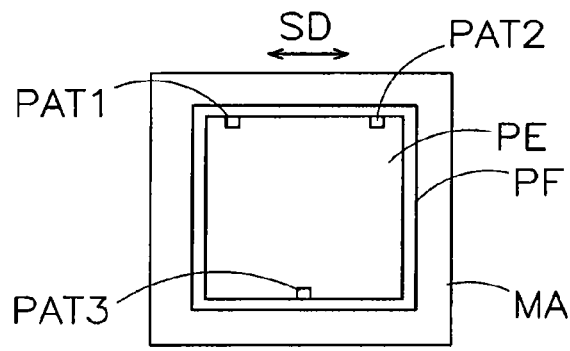
FIG. 4 depicts a highly schematic top view of a pattering device for a lithographic apparatus according to an embodiment of the invention.

With the patterns PAT1, PAT2 and PAT3 as depicted in FIG. 4, a position of the patterning device may be determined in multiple degrees of freedom. Making use of three corresponding encoders on the projection system, the position of the patterning device or mask may be determined in up to three degrees of freedom (when using single dimensional encoders), or in up to six degrees of freedom (when using two dimensional encoders, e.g. each providing a position in a dimension in a plane of drawing of FIG. 4 as well as in a dimension perpendicular to the plane of drawing). Also here, the encoder patterns may be repeated along the scanning direction to enable performing a position measurement with the encoders at various positions of the support along the scanning direction. Determining the position of the patterning device or mask in multiple dimensions will allow not only to take account of slip of the patterning device or mask in the direction of movement of the mask table, but also in other directions, such as a rotation about an axis perpendicular to the plane of drawing of FIG. 4.

The encoder pattern on the patterning device or mask may be located on a surface of the mask which is shielded by the pellicle PE, or outside it. If located on the surface which is shielded by the pellicle, then the encoder patterns may be positioned along an edge of the shielded surface, as along the edges, a small stripe is unused by the pattern of the patterning device or mask: due to the high angle of incidence of the beam on the patterning device, commonly a stripe is left open along the pellicle frame. Also, the encoder pattern(s) could be placed outside the surface of the patterning device or mask shielded by the pellicle, thereby on the one hand not interfering with the patterned beam to be projected onto the substrate, however on the other hand, to allow patterns to be placed outside the surface of the pattering device shielded by the pellicle, a part of the patterning device held by the mask table side supports MTSS will possibly require to be reduced, which may reduce a holding force on the mask. As will be appreciated by the skilled person, the positioning of the encoder patterns on certain parts of the surface of the mask will require a corresponding positioning of the encoder or encoders on the projection system.

The invention provides a method to detect, in a lithographic apparatus, slip of a patterning device relative to a support, the support being constructed to support the patterning device, the method including: measuring a position of the support relative to a first structure of the lithographic apparatus; measuring a position of the patterning device relative to a second structure of the lithographic apparatus; determining a correlation between the position of the patterning device and the position of the support from the measured position of the support, the measured position of the patterning device, and the mutual positions of the first and second structures; and deriving from the correlation a slip of the patterning device relative to the support. With this method, the same or similar benefits and effects may be obtained as with the lithographic apparatus according to the invention. Also, same or similar preferred embodiments may be provided.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate;
   a support position sensor to measure a position of the support relative to a first structure of the lithographic apparatus;
   a patterning device position sensor located at a second structure of the lithographic apparatus to measure a position of the patterning device relative to the second structure, wherein the second structure is not connected to the first structure; and
   a control device configured to determine a correlation between a first component of the position of the patterning device and a second component of the position of the support from the position measured by the support position sensor, the position measured by the patterning device position sensor, and mutual positions of the first and second structures, wherein the first and second components are taken along a coordinate axis fixed relative to the first and second structures.

2. The lithographic apparatus according to claim 1, wherein the second structure comprises the projection system and the first structure comprises a reference structure of the lithographic apparatus, the projection system being mounted to the reference structure.

3. The lithographic apparatus according to claim 1, wherein the lithographic apparatus comprises a structures position measurement system to measure the mutual positions of the first and second structures.

4. The lithographic apparatus according to claim 1, wherein the control device is configured to derive from the correlation a slip of the patterning device relative to the support.

5. The lithographic apparatus according to claim 4, wherein the control device is configured to compare the determined correlation during a movement of the support with a determined correlation of a previous movement of the support to estimate the slip of the patterning device relative to the support.

6. The lithographic apparatus according to claim 5, wherein the previous movement of the support and the movement of the support are in a same direction.

7. The lithographic apparatus according to claim 5, wherein the previous movement of the support and the movement of the support are in opposite directions.

8. The lithographic apparatus according to claim 4, wherein the patterning device position sensor is mounted to the projection system.

9. The lithographic apparatus according to claim 8, wherein the patterning device position sensor is mounted to a mounting of an upstream projection lens of the projection system.

10. The lithographic apparatus according to claim 8, wherein a plurality of patterning device position sensors are provided, the patterning device position sensors mounted at spaced apart positions on the projection system.

11. The lithographic apparatus according to claim 4, wherein the patterning device position sensor comprises an encoder measurement head to cooperate with an encoder pattern on the patterning device.

12. The lithographic apparatus according to claim 11, wherein the encoder measurement head comprises a two degrees of freedom encoder measurement head.

13. The lithographic apparatus according to claim 11, wherein three patterning device position sensors are provided, each comprising a two degrees of freedom encoder measurement head to provide a six degrees of freedom patterning device position signal.

14. The lithographic apparatus according to claim 11, wherein the or each encoder measurement head is positioned to detect an encoder pattern along a side of a surface of the patterning device shielded by a pellicle.

15. The lithographic apparatus according to claim 14, wherein the side extends along a patterning device scanning direction.

16. The lithographic apparatus according to claim 14, wherein the side extends substantially perpendicular to the patterning device scanning direction.

17. The lithographic apparatus according to claim 11, wherein the or each encoder measurement head is positioned to detect an encoder pattern on a surface of the patterning device outside the surface shielded by a pellicle.

18. A method of detecting, in a lithographic apparatus, slip of a patterning device relative to a support, the support being constructed to support the patterning device, the method comprising:
   measuring a position of the support relative to a first structure of the lithographic apparatus;
   measuring a position of the patterning device relative to a second structure of the lithographic apparatus via a sensor located at the second structure, wherein the second structure is not connected to the first structure;
   determining a correlation between a first component of the position of the patterning device and a second component of the position of the support from the measured position of the support, the measured position of the patterning device, and mutual positions of the first and second structures, wherein the first and second components are taken along a coordinate axis fixed relative to the first and second structures; and
   deriving from the correlation a slip of the patterning device relative to the support.

19. The method according to claim 18, wherein the second structure comprises a projection system, the projection system to project a radiation beam patterned by the patterning device onto a target portion of the substrate, the first structure comprising a reference structure of the lithographic apparatus.

20. The lithographic apparatus according to claim 18, comprising measuring the mutual positions of the first and second structures.

* * * * *